US010297572B2

(12) United States Patent
Dalal et al.

(10) Patent No.: US 10,297,572 B2
(45) Date of Patent: May 21, 2019

(54) DISCRETE FLEXIBLE INTERCONNECTS FOR MODULES OF INTEGRATED CIRCUITS

(71) Applicant: MC10, Inc., Lexington, MA (US)

(72) Inventors: Mitul Dalal, South Grafton, MA (US); Sanjay Gupta, Bedford, MA (US)

(73) Assignee: MC10, INC., Lexington, MA (US)

( * ) Notice: Subject to any disclaimer, the term of this patent is extended or adjusted under 35 U.S.C. 154(b) by 192 days.

(21) Appl. No.: 14/870,802

(22) Filed: Sep. 30, 2015

(65) Prior Publication Data

US 2016/0099227 A1  Apr. 7, 2016

Related U.S. Application Data

(60) Provisional application No. 62/060,147, filed on Oct. 6, 2014.

(51) Int. Cl.
*H01L 25/00* (2006.01)
*H01L 23/00* (2006.01)
(Continued)

(52) U.S. Cl.
CPC ...... *H01L 25/0655* (2013.01); *H01L 23/5385* (2013.01); *H01L 23/5387* (2013.01);
(Continued)

(58) Field of Classification Search
CPC . H01L 25/0655; H01L 25/50; H01L 23/5385; H01L 23/5387; H01L 23/5389;
(Continued)

(56) References Cited

U.S. PATENT DOCUMENTS 3,716,861 A  2/1973  Root
3,805,427 A  4/1974  Epstein
(Continued)

FOREIGN PATENT DOCUMENTS

CN  103619590 A  3/2014
EP  0585670 A2  3/1994
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Ida M Soward
(74) *Attorney, Agent, or Firm* — Nixon Peabody LLP

(57) ABSTRACT

Flexible interconnects, flexible integrated circuit systems and devices, and methods of making and using flexible integrated circuitry are presented herein. A flexible integrated circuit system is disclosed which includes first and second discrete devices that are electrically connected by a discrete flexible interconnect. The first discrete devices includes a first flexible multi-layer integrated circuit (IC) package with a first electrical connection pad on an outer surface thereof. The second discrete device includes a second flexible multi-layer integrated circuit (IC) package with a second electrical connection pad on an outer surface thereof. The discrete flexible interconnect is attached to and electrically connects the first electrical connection pad of the first discrete device to the second electrical connection pad of the second discrete device.

16 Claims, 3 Drawing Sheets

(51) Int. Cl.
  *H01L 25/065* (2006.01)
  *H01L 23/538* (2006.01)
  *H01L 23/66* (2006.01)
(52) U.S. Cl.
  CPC .......... *H01L 23/5389* (2013.01); *H01L 23/66* (2013.01); *H01L 24/19* (2013.01); *H01L 24/20* (2013.01); *H01L 24/48* (2013.01); *H01L 24/50* (2013.01); *H01L 24/73* (2013.01); *H01L 24/92* (2013.01); *H01L 24/95* (2013.01); *H01L 25/50* (2013.01); *H01L 23/5383* (2013.01); *H01L 24/13* (2013.01); *H01L 24/16* (2013.01); *H01L 24/29* (2013.01); *H01L 24/32* (2013.01); *H01L 24/45* (2013.01); *H01L 24/49* (2013.01); *H01L 24/83* (2013.01); *H01L 24/85* (2013.01); *H01L 24/86* (2013.01); *H01L 2223/6616* (2013.01); *H01L 2223/6677* (2013.01); *H01L 2224/04042* (2013.01); *H01L 2224/04105* (2013.01); *H01L 2224/05553* (2013.01); *H01L 2224/05554* (2013.01); *H01L 2224/131* (2013.01); *H01L 2224/16227* (2013.01); *H01L 2224/2919* (2013.01); *H01L 2224/32013* (2013.01); *H01L 2224/32225* (2013.01); *H01L 2224/45015* (2013.01); *H01L 2224/45144* (2013.01); *H01L 2224/45147* (2013.01); *H01L 2224/4809* (2013.01); *H01L 2224/48091* (2013.01); *H01L 2224/48101* (2013.01); *H01L 2224/48157* (2013.01); *H01L 2224/48499* (2013.01); *H01L 2224/49176* (2013.01); *H01L 2224/50* (2013.01); *H01L 2224/73219* (2013.01); *H01L 2224/73265* (2013.01); *H01L 2224/73267* (2013.01); *H01L 2224/8385* (2013.01); *H01L 2224/85005* (2013.01); *H01L 2224/85203* (2013.01); *H01L 2224/85205* (2013.01); *H01L 2224/85207* (2013.01); *H01L 2224/85801* (2013.01); *H01L 2224/86005* (2013.01); *H01L 2224/86801* (2013.01); *H01L 2224/92244* (2013.01); *H01L 2224/92247* (2013.01); *H01L 2224/92248* (2013.01); *H01L 2224/95* (2013.01); *H01L 2224/95001* (2013.01); *H01L 2924/14* (2013.01)

(58) Field of Classification Search
  CPC ..... H01L 24/32; H01L 24/83; H01L 23/4985; H01L 23/3114; H01L 23/3135; H01L 24/42; H01L 24/43; H01L 24/44; H01L 24/45; H01L 24/46; H01L 24/47; H01L 24/48; H01L 24/49; H01L 25/0652
  See application file for complete search history.

(56) References Cited

U.S. PATENT DOCUMENTS

| | | | |
|---|---|---|---|
| 4,304,235 A | 12/1981 | Kaufman | |
| 4,416,288 A | 11/1983 | Freeman | |
| 4,558,395 A * | 12/1985 | Yamada | H01L 23/4332 257/E23.091 |
| 4,658,153 A | 4/1987 | Brosh | |
| 5,050,036 A * | 9/1991 | Oudick | H01L 23/473 165/80.4 |
| 5,306,917 A | 4/1994 | Black | |
| 5,326,521 A | 7/1994 | East | |
| 5,331,966 A | 7/1994 | Bennett | |
| 5,360,987 A | 11/1994 | Shibib | |
| 5,454,270 A | 10/1995 | Brown | |
| 5,491,651 A | 2/1996 | Janic | |
| 5,567,975 A | 10/1996 | Walsh | |
| 5,580,794 A | 12/1996 | Allen | |
| 5,617,870 A | 4/1997 | Hastings | |
| 5,776,797 A * | 7/1998 | Nicewarner, Jr. | H01L 23/5387 257/E23.177 |
| 5,811,790 A | 9/1998 | Endo | |
| 5,817,008 A | 10/1998 | Rafert | |
| 5,907,477 A | 5/1999 | Tuttle | |
| 6,027,958 A * | 2/2000 | Vu | H01L 21/568 257/679 |
| 6,063,046 A | 5/2000 | Allum | |
| 6,265,090 B1 | 7/2001 | Nishide | |
| 6,282,960 B1 | 9/2001 | Samuels et al. | |
| 6,343,514 B1 | 2/2002 | Smith | |
| 6,387,052 B1 | 5/2002 | Quinn | |
| 6,421,016 B1 | 7/2002 | Phillips | |
| 6,455,930 B1 * | 9/2002 | Palanisamy | H01S 5/02248 174/252 |
| 6,455,931 B1 | 9/2002 | Hamilton | |
| 6,567,158 B1 | 5/2003 | Falcial | |
| 6,641,860 B1 | 11/2003 | Kaiserman | |
| 6,775,906 B1 | 8/2004 | Silverbrook | |
| 6,784,844 B1 | 8/2004 | Boakes | |
| 6,936,855 B1 * | 8/2005 | Harrah | F21K 9/00 257/59 |
| 6,965,160 B2 | 11/2005 | Cobbley | |
| 6,987,314 B1 | 1/2006 | Yoshida | |
| 7,141,874 B2 * | 11/2006 | Nakatani | H01L 23/49805 156/252 |
| 7,259,030 B2 | 8/2007 | Daniels | |
| 7,265,298 B2 | 9/2007 | Maghribi | |
| 7,302,751 B2 | 12/2007 | Hamburgen | |
| 7,337,012 B2 | 2/2008 | Maghribi | |
| 7,487,587 B2 | 2/2009 | Vanfleteren | |
| 7,491,892 B2 | 2/2009 | Wagner | |
| 7,521,292 B2 | 4/2009 | Rogers | |
| 7,557,367 B2 | 7/2009 | Rogers | |
| 7,618,260 B2 | 11/2009 | Daniel | |
| 7,622,367 B1 | 11/2009 | Nuzzo | |
| 7,649,245 B2 * | 1/2010 | Zingher | H01L 23/48 257/664 |
| 7,656,673 B1 * | 2/2010 | Fries | H05K 1/189 361/744 |
| 7,727,228 B2 | 6/2010 | Abboud | |
| 7,739,791 B2 | 6/2010 | Brandenburg | |
| 7,759,167 B2 | 7/2010 | Vanfleteren | |
| 7,960,246 B2 | 6/2011 | Flamand | |
| 7,982,296 B2 | 7/2011 | Nuzzo | |
| 8,097,926 B2 | 1/2012 | De Graff | |
| 8,129,823 B2 * | 3/2012 | Tanikella | H01L 21/4857 257/643 |
| 8,198,621 B2 | 6/2012 | Rogers | |
| 8,207,473 B2 | 6/2012 | Axisa | |
| 8,217,381 B2 | 7/2012 | Rogers | |
| 8,372,726 B2 | 2/2013 | De Graff | |
| 8,389,862 B2 | 3/2013 | Arora | |
| 8,431,828 B2 | 4/2013 | Vanfleteren | |
| 8,440,546 B2 | 5/2013 | Nuzzo | |
| 8,472,207 B2 * | 6/2013 | Rendek, Jr. | H05K 1/186 174/255 |
| 8,536,667 B2 | 9/2013 | De Graff | |
| 8,552,299 B2 | 10/2013 | Rogers | |
| 8,664,699 B2 | 3/2014 | Nuzzo | |
| 8,679,888 B2 | 3/2014 | Rogers | |
| 8,729,524 B2 | 5/2014 | Rogers | |
| 8,754,396 B2 | 6/2014 | Rogers | |
| 8,865,489 B2 | 10/2014 | Rogers | |
| 8,879,276 B2 * | 11/2014 | Wang | H05K 1/189 174/254 |
| 8,886,334 B2 | 11/2014 | Ghaffari | |
| 8,905,772 B2 | 12/2014 | Rogers | |
| 9,012,784 B2 | 4/2015 | Arora | |
| 9,082,025 B2 | 7/2015 | Fastert | |
| 9,105,555 B2 | 8/2015 | Rogers | |
| 9,105,782 B2 | 8/2015 | Rogers | |
| 9,119,533 B2 | 9/2015 | Ghaffari | |
| 9,123,614 B2 | 9/2015 | Graff | |
| 9,159,635 B2 | 10/2015 | Elolampi | |
| 9,168,094 B2 | 10/2015 | Lee | |
| 9,171,794 B2 | 10/2015 | Rafferty | |

(56) References Cited

U.S. PATENT DOCUMENTS

| | | | |
|---|---|---|---|
| 9,186,060 B2 | 11/2015 | De Graff | |
| 9,209,151 B2* | 12/2015 | Chauhan | H01L 24/26 |
| 9,407,798 B2* | 8/2016 | Havskjold | H05K 1/028 |
| 2001/0006252 A1* | 7/2001 | Kim | H01L 23/5387 |
| | | | 257/688 |
| 2001/0012918 A1 | 8/2001 | Swanson | |
| 2001/0021867 A1 | 9/2001 | Kordis | |
| 2002/0026127 A1 | 2/2002 | Balbierz | |
| 2002/0082515 A1 | 6/2002 | Campbell | |
| 2002/0094701 A1 | 7/2002 | Biegelsen | |
| 2002/0113739 A1 | 8/2002 | Howard | |
| 2002/0128700 A1 | 9/2002 | Cross, Jr. | |
| 2002/0145467 A1 | 10/2002 | Minch | |
| 2002/0151934 A1 | 10/2002 | Levine | |
| 2002/0158330 A1 | 10/2002 | Moon | |
| 2003/0017848 A1 | 1/2003 | Engstrom | |
| 2003/0045025 A1 | 3/2003 | Coyle | |
| 2003/0081392 A1* | 5/2003 | Cady | H01L 23/3114 |
| | | | 361/767 |
| 2003/0097165 A1 | 5/2003 | Krulevitch | |
| 2003/0120271 A1 | 6/2003 | Burnside | |
| 2003/0162507 A1 | 8/2003 | Vatt | |
| 2003/0214408 A1 | 11/2003 | Grajales | |
| 2003/0236455 A1 | 12/2003 | Swanson | |
| 2004/0006264 A1 | 1/2004 | Mojarradi | |
| 2004/0052052 A1* | 3/2004 | Rivera | H01L 23/427 |
| | | | 361/700 |
| 2004/0085469 A1 | 5/2004 | Johnson | |
| 2004/0092806 A1 | 5/2004 | Sagon | |
| 2004/0106334 A1 | 6/2004 | Suzuki | |
| 2004/0135094 A1 | 7/2004 | Niigaki | |
| 2004/0138558 A1 | 7/2004 | Dunki-Jacobs | |
| 2004/0149921 A1 | 8/2004 | Smyk | |
| 2004/0178466 A1 | 9/2004 | Merrill | |
| 2004/0192082 A1 | 9/2004 | Wagner | |
| 2004/0201134 A1 | 10/2004 | Kawai | |
| 2004/0203486 A1 | 10/2004 | Shepherd | |
| 2004/0221370 A1 | 11/2004 | Hannula | |
| 2004/0243204 A1 | 12/2004 | Maghribi | |
| 2005/0021103 A1 | 1/2005 | DiLorenzo | |
| 2005/0067293 A1 | 3/2005 | Naito | |
| 2005/0070778 A1 | 3/2005 | Lackey | |
| 2005/0096513 A1 | 5/2005 | Ozguz | |
| 2005/0113744 A1 | 5/2005 | Donoghue | |
| 2005/0139683 A1 | 6/2005 | Yi | |
| 2005/0171524 A1 | 8/2005 | Stern | |
| 2005/0203366 A1 | 9/2005 | Donoghue | |
| 2006/0003709 A1 | 1/2006 | Wood | |
| 2006/0038182 A1 | 2/2006 | Rogers | |
| 2006/0071349 A1 | 4/2006 | Tokushige | |
| 2006/0084394 A1 | 4/2006 | Engstrom | |
| 2006/0106321 A1 | 5/2006 | Lewinsky | |
| 2006/0128346 A1 | 6/2006 | Yasui | |
| 2006/0154398 A1 | 7/2006 | Qing | |
| 2006/0160560 A1 | 7/2006 | Josenhans | |
| 2006/0248946 A1 | 11/2006 | Howell | |
| 2006/0257945 A1 | 11/2006 | Masters | |
| 2006/0264767 A1 | 11/2006 | Shennib | |
| 2006/0286785 A1 | 12/2006 | Rogers | |
| 2007/0027514 A1 | 2/2007 | Gerber | |
| 2007/0031283 A1 | 2/2007 | Davis | |
| 2007/0108389 A1 | 5/2007 | Makela | |
| 2007/0113399 A1 | 5/2007 | Kumar | |
| 2007/0123756 A1 | 5/2007 | Kitajima | |
| 2007/0270672 A1 | 11/2007 | Hayter | |
| 2008/0046080 A1 | 2/2008 | Vanden Bulcke | |
| 2008/0074383 A1 | 3/2008 | Dean | |
| 2008/0096620 A1 | 4/2008 | Lee | |
| 2008/0139894 A1 | 6/2008 | Szydlo-Moore | |
| 2008/0143379 A1* | 6/2008 | Norman | H01L 23/50 |
| | | | 326/39 |
| 2008/0157235 A1 | 7/2008 | Rogers | |
| 2008/0193749 A1 | 8/2008 | Thompson | |
| 2008/0204021 A1 | 8/2008 | Leussler | |
| 2008/0211087 A1 | 9/2008 | Mueller-Hipper | |
| 2008/0237840 A1 | 10/2008 | Alcoe | |
| 2008/0259576 A1 | 10/2008 | Johnson | |
| 2008/0287167 A1 | 11/2008 | Caine | |
| 2008/0313552 A1 | 12/2008 | Buehler | |
| 2009/0000377 A1 | 1/2009 | Shipps | |
| 2009/0001550 A1 | 1/2009 | Li | |
| 2009/0015560 A1 | 1/2009 | Robinson | |
| 2009/0016032 A1* | 1/2009 | Chow | H01L 25/03 |
| | | | 361/749 |
| 2009/0017884 A1 | 1/2009 | Rotschild | |
| 2009/0048556 A1 | 2/2009 | Durand | |
| 2009/0088750 A1 | 4/2009 | Hushka | |
| 2009/0107704 A1 | 4/2009 | Vanfleteren | |
| 2009/0154736 A1 | 6/2009 | Lee | |
| 2009/0184254 A1 | 7/2009 | Miura | |
| 2009/0204168 A1 | 8/2009 | Kallmyer | |
| 2009/0215385 A1 | 8/2009 | Waters | |
| 2009/0225751 A1 | 9/2009 | Koenck | |
| 2009/0261828 A1 | 10/2009 | Nordmeyer-Massner | |
| 2009/0273909 A1 | 11/2009 | Shin | |
| 2009/0283891 A1 | 11/2009 | Dekker | |
| 2009/0291508 A1 | 11/2009 | Babu | |
| 2009/0294803 A1 | 12/2009 | Nuzzo | |
| 2009/0302760 A1* | 12/2009 | Tchakarov | H01L 51/5203 |
| | | | 313/512 |
| 2009/0322480 A1 | 12/2009 | Benedict | |
| 2010/0002402 A1 | 1/2010 | Rogers | |
| 2010/0059863 A1 | 3/2010 | Rogers | |
| 2010/0072577 A1 | 3/2010 | Nuzzo | |
| 2010/0073669 A1 | 3/2010 | Colvin | |
| 2010/0087782 A1 | 4/2010 | Ghaffari | |
| 2010/0090781 A1 | 4/2010 | Yamamoto | |
| 2010/0090824 A1 | 4/2010 | Rowell | |
| 2010/0116526 A1 | 5/2010 | Arora | |
| 2010/0117660 A1 | 5/2010 | Douglas | |
| 2010/0178722 A1 | 7/2010 | De Graff | |
| 2010/0245011 A1 | 9/2010 | Chatzopoulos | |
| 2010/0271191 A1 | 10/2010 | De Graff | |
| 2010/0298895 A1 | 11/2010 | Ghaffari | |
| 2010/0317132 A1 | 12/2010 | Rogers | |
| 2010/0321161 A1 | 12/2010 | Isabell | |
| 2010/0327387 A1 | 12/2010 | Kasai | |
| 2011/0011179 A1 | 1/2011 | Gustafsson | |
| 2011/0034912 A1 | 2/2011 | De Graff | |
| 2011/0051384 A1 | 3/2011 | Kriechbaum | |
| 2011/0054583 A1 | 3/2011 | Litt | |
| 2011/0101789 A1 | 5/2011 | Salter | |
| 2011/0121822 A1 | 5/2011 | Parsche | |
| 2011/0140897 A1 | 6/2011 | Purks | |
| 2011/0175735 A1 | 7/2011 | Forster | |
| 2011/0184320 A1 | 7/2011 | Shipps | |
| 2011/0215931 A1 | 9/2011 | Callsen | |
| 2011/0218756 A1 | 9/2011 | Callsen | |
| 2011/0218757 A1 | 9/2011 | Callsen | |
| 2011/0220890 A1 | 9/2011 | Nuzzo | |
| 2011/0277813 A1 | 11/2011 | Rogers | |
| 2011/0306851 A1 | 12/2011 | Wang | |
| 2012/0016258 A1 | 1/2012 | Webster | |
| 2012/0051005 A1 | 3/2012 | Vanfleteren | |
| 2012/0052268 A1 | 3/2012 | Axisa | |
| 2012/0065937 A1 | 3/2012 | De Graff | |
| 2012/0074546 A1 | 3/2012 | Chong | |
| 2012/0087216 A1 | 4/2012 | Keung | |
| 2012/0091594 A1 | 4/2012 | Landesberger | |
| 2012/0092178 A1 | 4/2012 | Callsen | |
| 2012/0092222 A1 | 4/2012 | Kato | |
| 2012/0101413 A1 | 4/2012 | Beetel | |
| 2012/0101538 A1 | 4/2012 | Ballakur | |
| 2012/0108012 A1 | 5/2012 | Yasuda | |
| 2012/0157804 A1 | 6/2012 | Rogers | |
| 2012/0170231 A1* | 7/2012 | Lee | H05K 1/145 |
| | | | 361/749 |
| 2012/0172697 A1 | 7/2012 | Urman | |
| 2012/0226130 A1 | 9/2012 | De Graff | |
| 2012/0244848 A1 | 9/2012 | Ghaffari | |
| 2012/0256308 A1 | 10/2012 | Helin | |
| 2012/0314382 A1 | 12/2012 | Wesselmann | |
| 2012/0316455 A1 | 12/2012 | Rahman | |
| 2012/0327608 A1 | 12/2012 | Rogers | |

(56) References Cited

U.S. PATENT DOCUMENTS

| | | |
|---|---|---|
| 2013/0041235 A1 | 2/2013 | Rogers |
| 2013/0056862 A1* | 3/2013 | Kim .................. H01L 25/0657 257/692 |
| 2013/0099358 A1 | 4/2013 | Elolampi |
| 2013/0100618 A1 | 4/2013 | Rogers |
| 2013/0118255 A1 | 5/2013 | Callsen |
| 2013/0150693 A1 | 6/2013 | D'angelo |
| 2013/0185003 A1 | 7/2013 | Carbeck |
| 2013/0192356 A1 | 8/2013 | De Graff |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0274562 A1 | 10/2013 | Ghaffari |
| 2013/0313713 A1 | 11/2013 | Arora |
| 2013/0316442 A1 | 11/2013 | Meurville |
| 2013/0316487 A1 | 11/2013 | De Graff |
| 2013/0320503 A1 | 12/2013 | Nuzzo |
| 2013/0321373 A1 | 12/2013 | Yoshizumi |
| 2013/0335011 A1 | 12/2013 | Bohringer |
| 2014/0001058 A1 | 1/2014 | Ghaffari |
| 2014/0012160 A1 | 1/2014 | Ghaffari |
| 2014/0012242 A1 | 1/2014 | Lee |
| 2014/0021522 A1* | 1/2014 | Lin ..................... H01L 23/642 257/299 |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0133179 A1* | 5/2014 | Franklin ............. G02B 6/0093 362/612 |
| 2014/0140020 A1 | 5/2014 | Rogers |
| 2014/0183698 A1* | 7/2014 | Hsu ..................... H01L 28/40 257/532 |
| 2014/0188426 A1 | 7/2014 | Fastert |
| 2014/0191236 A1 | 7/2014 | Nuzzo |
| 2014/0216524 A1 | 8/2014 | Rogers |
| 2014/0240932 A1 | 8/2014 | Hsu |
| 2014/0249520 A1 | 9/2014 | Ghaffari |
| 2014/0268594 A1* | 9/2014 | Wang .................. H05K 1/183 361/749 |
| 2014/0268780 A1* | 9/2014 | Wang .................. F21V 19/003 362/249.06 |
| 2014/0303452 A1 | 10/2014 | Ghaffari |
| 2014/0340857 A1 | 11/2014 | Hsu |
| 2014/0364794 A1* | 12/2014 | Jordan ................ A61N 1/044 604/20 |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0035680 A1 | 2/2015 | Li |
| 2015/0069617 A1 | 3/2015 | Arora |
| 2015/0099976 A1 | 4/2015 | Ghaffari |
| 2015/0100135 A1 | 4/2015 | Ives |
| 2015/0194817 A1 | 7/2015 | Lee |
| 2015/0237711 A1 | 8/2015 | Rogers |
| 2015/0241288 A1 | 8/2015 | Keen |
| 2015/0260713 A1 | 9/2015 | Ghaffari |
| 2015/0272652 A1 | 10/2015 | Ghaffari |
| 2015/0286913 A1 | 10/2015 | Fastert |
| 2015/0320472 A1 | 11/2015 | Ghaffari |
| 2015/0335254 A1 | 11/2015 | Fastert |
| 2015/0342036 A1 | 11/2015 | Elolampi |
| 2015/0348942 A1* | 12/2015 | Kim .................. H01L 25/0657 257/773 |
| 2015/0380848 A1* | 12/2015 | Kato .................. H05K 1/147 439/67 |
| 2016/0056102 A1* | 2/2016 | Konchady ........ H01L 23/5383 174/263 |

FOREIGN PATENT DOCUMENTS

| | | |
|---|---|---|
| EP | 2259062 A2 | 12/2010 |
| JP | H04 290489 A | 10/1992 |
| JP | 05-087511 A | 4/1993 |
| JP | 2009-170173 A | 7/2009 |
| WO | WO 99/38211 A2 | 7/1999 |
| WO | WO 2005/122285 A2 | 12/2005 |
| WO | WO 03/021679 A2 | 3/2006 |
| WO | WO 2007/003019 A2 | 1/2007 |
| WO | WO 2007/116344 A1 | 10/2007 |
| WO | WO 2007/136726 A2 | 11/2007 |
| WO | WO 2008/030960 A2 | 3/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |
| WO | WO 2011/041727 A1 | 4/2011 |
| WO | WO 2011/084450 A1 | 7/2011 |
| WO | WO 2011/084709 A2 | 7/2011 |
| WO | WO 2011/127331 A2 | 10/2011 |
| WO | WO 2012/125494 A2 | 9/2012 |
| WO | WO 2012/166686 A2 | 12/2012 |
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |
| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |

OTHER PUBLICATIONS

Demura et al., "Immobilization of Glucose Oxidase with Bombyx Mori Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

(56) References Cited

OTHER PUBLICATIONS

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Siegel et al., "Foldable Printed Circuit Boards on Paper Substrates," Advanced Functional Materials, vol. 20, No. 1, 28-35, (8 pages) (Jan. 8, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

International Search Report, PCT/US2015/053647, 2 pages (Jan. 7, 2016).

Written Opinion, PCT/US2015/053647, 7 pages (Jan. 7, 2016).

Cauwe M. et al., "Flexible and Stretchable Circuit Technologies for Space Applications," $5^{th}$ Electronic Materials, Processes and Packaging for Space, May 22, 2014, XP055449783, downloaded at https://escies.org/download/webDocumentFile?id=61963 (18 pages).

European Patent Office, Extended European Search Report in European Patent Application No. 15848328.9, dated Feb. 20, 2018 (10 pages).

\* cited by examiner

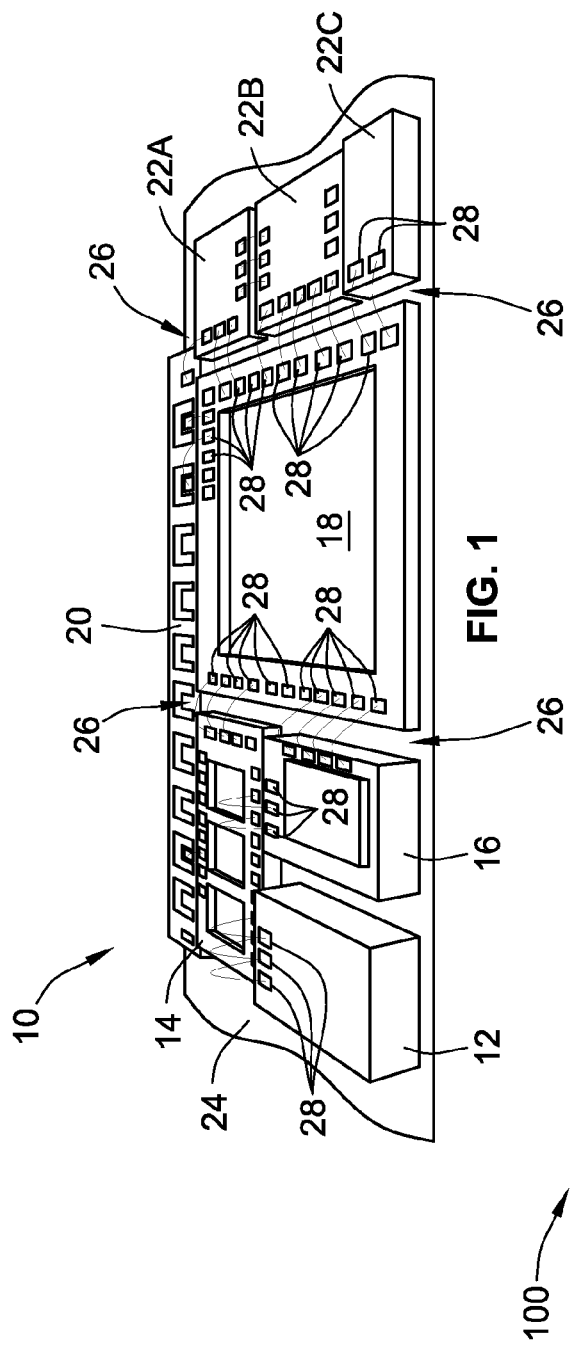
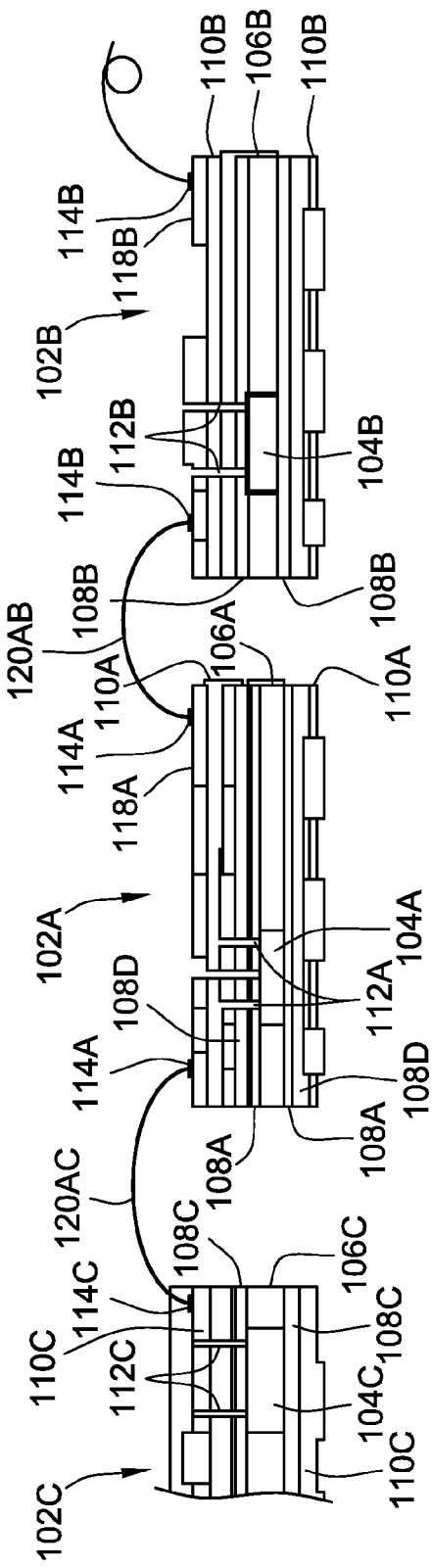
FIG. 1
FIG. 2

DISCRETE FLEXIBLE INTERCONNECTS FOR MODULES OF INTEGRATED CIRCUITS

CLAIM OF PRIORITY AND CROSS-REFERENCE TO RELATED APPLICATION

This application claims the benefit of priority to U.S. Provisional Patent Application No. 62/060,147, which was filed on Oct. 6, 2014, and is incorporated herein by reference in its entirety.

TECHNICAL FIELD

The present disclosure relates generally to printed circuit boards (PCB) and integrated circuits (IC). More particularly, aspects of this disclosure relate to bendable, stretchable and compressible interconnects for flexible integrated circuitry.

BACKGROUND

Integrated circuits (IC) are the cornerstone of the information age and the foundation of today's information technology industries. The integrated circuit, a.k.a. "chip" or "microchip," is a set of interconnected electronic components, such as transistors, capacitors, and resistors, which are etched or imprinted onto a tiny wafer of semiconducting material, such as silicon or germanium. Integrated circuits take on various forms including, as some non-limiting examples, microprocessors, amplifiers, Flash memories, application specific integrated circuits (ASICs), static random access memories (SRAMs), digital signal processors (DSPs), dynamic random access memories (DRAMs), erasable programmable read only memories (EPROMs), and programmable logic. Integrated circuits are used in innumerable products, including personal computers, laptop and tablet computers, smartphones, flat-screen televisions, medical instruments, telecommunication and networking equipment, airplanes, watercraft and automobiles.

Advances in integrated circuit technology and microchip manufacturing have led to a steady decrease in chip size and an increase in circuit density and circuit performance. The scale of semiconductor integration has advanced to the point where a single semiconductor chip can hold tens of millions to over a billion devices in a space smaller than a U.S. penny. Moreover, the width of each conducting line in a modern microchip can be made as small as a fraction of a nanometer. The operating speed and overall performance of a semiconductor chip (e.g., clock speed and signal net switching speeds) has concomitantly increased with the level of integration. To keep pace with increases in on-chip circuit switching frequency and circuit density, semiconductor packages currently offer higher pin counts, greater power dissipation, more protection, and higher speeds than packages of just a few years ago.

Conventional microchips are generally rigid structures that are not designed to be bent or stretched during normal operating conditions. In addition, IC's are typically mounted on a printed circuit board (PCB) that is as thick or thicker than the IC and similarly rigid. Processes using thick and rigid printed circuit boards are generally incompatible with chips that are thinned or intended for applications requiring elasticity. Consequently, many schemes have been proposed for embedding microchips on or in a flexible polymeric substrate. Flexible electronic circuitry employing an elastic substrate material allows the IC to be adapted into innumerable shapes. This, in turn, enables many useful device configurations not otherwise possible with rigid silicon-based electronic devices. However, some flexible electronic circuit designs are unable to sufficiently conform to their surroundings because the interconnecting components are unable to flex in response to conformation changes. Such flexible circuit configurations are prone to damage, electronic degradation, and can be unreliable under rigorous use scenarios.

Many flexible circuits now employ stretchable and bendable interconnects that remain intact while the system stretches and bends. An "interconnect" in integrated circuits electrically couples the IC modules to distribute clock and other signals and provide power/ground throughout the electrical system. Some flexible interconnects capable of bending and elasticity comprise metal segments that are embedded in an elastomer. For example, one known approach includes using micro-fabricated tortuous wires encased in a silicone elastomer to enable significant linear strain while maintaining conductivity. Elastically stretchable metal interconnects, however, tend to experience an increase in resistance with mechanical strain. There is therefore a continuing need for improved stretchable interconnects having improved stretchability, electrical conductivity, and related properties for rapid and reliable manufacture of flexible electronic circuitry in a variety of different configurations.

SUMMARY

Disclosed herein are flexible interconnects for modules of integrated circuits and methods of making and methods of using the same. Embodiments of this disclosure include stretchable interconnect fabrication between modules of ultrathin embedded Silicon IC die. Aspects of this disclosure are for "extremely stretchable" electrical interconnects, flexible electronic circuitry using such extremely stretchable electrical interconnects, and methods of making and methods of using the same. In at least some embodiments, methods are disclosed for fabricating extremely stretchable integrated circuit electronics that are capable of stretching and compressing and bending while withstanding high translational strains, such as in the range of −100% to 100% and, in some embodiments, up to −100,000% to +100,000%, and/or high rotational strains, such as to an extent of 180° or greater, while substantially maintaining electrical performance found in an unstrained state. Contrastingly, electronics fabricated from rigid single-crystal semiconductor materials or other rigid substrate materials are comparatively inflexible and brittle—many cannot withstand strains of greater than about +/−2%.

Conventional methods of manufacturing flexible electronic circuits involve fabricating the interconnects in the material that is embedding the IC modules as a continuous single-piece structure. These existing processes are not always desirable because they: (1) waste material; (2) restrict the shape of the final package to maximize substrate real estate; (3) result in Loss of Yield and increased cost for each faulty part; (4) increase material costs; and (4) are relatively expensive manufacturing processes. By way of contrast, embodiments of the present disclosure are directed to flexible multi-layer polymeric (e.g., silicon (Si)) interconnects that are fabricated separately from the IC islands and subsequently attached or coupled to connection pads on outer (top) surfaces of adjacent IC islands. Embodiments of the present disclosure are also directed to metal interconnects (e.g., gold (Au) or copper (Cu) wirebonds) that are fabricated separately from the IC islands and subsequently attached or coupled to connection pads on outer (top) surfaces of adjacent IC islands. Also disclosed are stretchable interconnects fabricated from electrically conductive paste that are fabricated separately from the IC islands and subsequently attached or coupled to connection pads on outer (top) surfaces of adjacent IC islands. Advantages of one or more of the disclosed configurations may include reduction/elimination of wasted material, limited/no restrictions on the shape of the final package, minimal Loss of Yield, and reduced material costs and manufacturing costs.

Aspects of the present disclosure are directed to a flexible integrated circuit system. The flexible integrated circuit system includes first and second discrete devices. The first discrete device includes a first flexible multi-layer integrated circuit (IC) package with a first electrical connection pad on a first outer surface thereof. In this regard, the second discrete device includes a second flexible multi-layer integrated circuit (IC) package with a second electrical connection pad on a second outer surface thereof. A discrete flexible interconnect is attached or coupled to and electrically connects the first electrical connection pad of the first discrete device to the second electrical connection pad of the second discrete device.

According to other aspects of the present disclosure, an extremely flexible IC apparatus is presented. The IC apparatus comprises a first flexible multi-layer integrated circuit (IC) package with a first microchip embedded in or on a first flexible polymeric substrate, and a first pair of adhesive layers, each of which is disposed on a respective side of the first flexible polymeric substrate. The first IC package also includes a first pair of conductive sheets, each of which is attached to the first flexible polymeric substrate by a respective one of the first adhesive layers, and a first electrical connection pad attached to an outer surface of one of the first conductive sheets. The IC apparatus further comprises a second flexible multi-layer IC package that is separate and distinct from the first IC package. The second IC package includes a second microchip embedded in or on a second flexible polymeric substrate, and a second pair of adhesive layers, each of which is disposed on a respective side of the second flexible polymeric substrate. The second IC package also includes a second pair of conductive sheets, each of which is attached to the second flexible polymeric substrate by a respective one of the second adhesive layers, and a second electrical connection pad attached to an outer surface of one of the second conductive sheets. A flexible interconnect, which is separate and distinct from the first and second IC packages, electrically connects the first electrical connection pad to the second electrical connection pad and mechanically couples the first flexible multi-layer IC package to the second flexible multi-layer IC package.

Other aspects of the present disclosure are directed to methods for making and methods for using flexible integrated circuits. In one aspect, the method includes: providing a first discrete device with a first flexible multi-layer integrated circuit (IC) package including a first outer surface with a first electrical connection pad; providing a second discrete device with a second flexible multi-layer integrated circuit (IC) package including a second outer surface with a second electrical connection pad; and, electrically connecting a discrete flexible interconnect to the first electrical connection pad of the first discrete device and the second electrical connection pad of the second discrete device.

For any of the disclosed configurations, the flexible interconnect may comprise one or more pliant metal wires. Each of the pliant metal wires may comprise in-plane loops or out-of-plane-loops, or both, configured to increase flexibility. For any of the disclosed configurations, the flexible interconnect may comprise a pliant multi-layer semiconductor. In this instance, the first flexible multi-layer IC package, the second flexible multi-layer IC package, and the pliant multi-layer semiconductor of the flexible interconnect all comprise common layers of materials, according to some embodiments. For any of the disclosed configurations, the flexible interconnect may comprise a conductive substrate fabricated from an electrically conductive paste. In this instance, the flexible interconnect may comprise a web of metallic interconnects printed onto the substrate. One or more or all of the disclosed configurations may be implemented as an "extremely stretchable" IC device.

The above summary is not intended to represent each embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

FIG. 1 is a perspective-view illustration of an example of a flexible electronic circuit system with integrated circuit (IC) packages connected by pliant wirebonded interconnects in accord with aspects of the present disclosure.

FIG. 2 is a cross-sectional side-view illustration of a representative flexible electronic circuit system with a plurality of multi-layer IC modules connected by pliant wirebonded interconnects in accord with aspects of the present disclosure.

Figure 3:
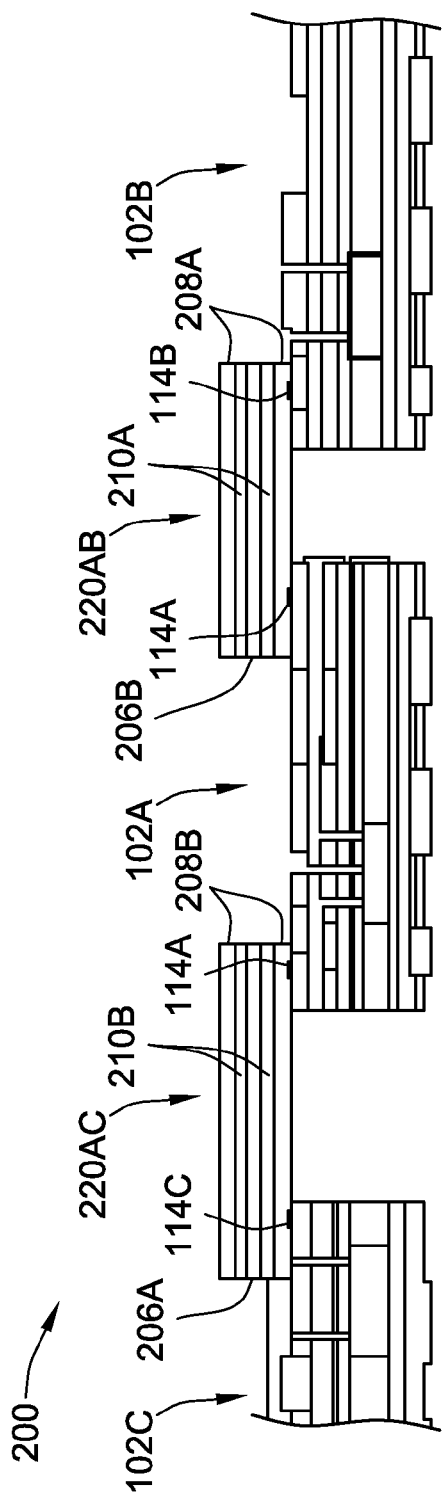
FIG. 3 is a cross-sectional side-view illustration of a representative flexible electronic circuit system with a plurality of multi-layer IC modules connected by pliant multi-layer polymeric interconnects in accord with aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, combinations, subcombinations, and alternatives falling within the spirit and scope of the invention as defined by the appended claims.

DETAILED DESCRIPTION OF THE ILLUSTRATED EMBODIMENTS

This disclosure is susceptible of embodiment in many different forms. There are shown in the drawings, and will herein be described in detail, representative embodiments with the understanding that the present disclosure is to be considered as an exemplification of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed or logically prohibited: the singular includes the plural and vice versa; and the word "including" or "comprising" or "having" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

The terms "flexible" and "stretchable" and "bendable," including roots and derivatives thereof, when used as an adjective to modify electrical circuitry, electrical systems, and electrical devices or apparatuses, are meant to encompass electronics that comprise at least some components having pliant or elastic properties such that the circuit is capable of being flexed, stretched and/or bent, respectively, without tearing or breaking or compromising their electrical characteristics. These terms are also meant to encompass circuitry having components (whether or not the components themselves are individually stretchable, flexible or bendable) that are configured in such a way so as to accommodate and remain functional when applied to a stretchable, bendable, inflatable, or otherwise pliant surface. In configurations deemed "extremely stretchable," the circuitry is capable of stretching and/or compressing and/or bending while withstanding high translational strains, such as in the range of −100% to 100% and, in some embodiments, up to −100,000% to +100,000%, and/or high rotational strains, such as to an extent of 180° or greater, without fracturing or breaking and while substantially maintaining electrical performance found in an unstrained state.

The discrete "islands" or "packages" mentioned herein are discrete operative devices, e.g., arranged in a "device island" arrangement, and are themselves capable of performing the functionality described herein, or portions thereof. Such functionality of the operative devices can include, for example, integrated circuits, physical sensors (e.g. temperature, pH, light, radiation, etc.), biological sensors, chemical sensors, amplifiers, A/D and D/A converters, optical collectors, electro-mechanical transducers, piezo-electric actuators, light emitting electronics (e.g., LEDs), and any combination thereof. A purpose and an advantage of using one or more standard ICs (e.g., CMOS on single crystal silicon) is to use high-quality, high-performance, and high-functioning circuit components that are readily accessible and mass-produced with well-known processes, and which provide a range of functionality and generation of data far superior to that produced by passive means. The discrete islands may range from about, but not limited to, 10-100 micrometers (μm) in size measured on an edge or by diameter.

Referring now to the drawings, wherein like reference numerals refer to like components throughout the several views, FIG. 1 illustrates an example of a flexible integrated circuit (IC) system, designated generally as 10, which may be adapted as or integrated into an "extremely stretchable" IC apparatus. Many of the disclosed concepts are discussed with reference to the representative systems depicted in the drawings; the systems illustrated herein, however, are provided merely as exemplary applications by which the various inventive aspects and features of this disclosure can be applied. Thus, the novel aspects and features of the present disclosure are not per se limited to the particular arrangements and components presented in the drawings. Moreover, only selected components of the system(s) have been shown and will be described in additional detail hereinbelow. Nevertheless, the systems and devices discussed herein can include numerous additional and alternative features, and other well-known peripheral components, for example, for carrying out the various methods and functions disclosed herein. Some of the illustrated components are optional and, thus, can be removed.

The flexible IC system 10 of FIG. 1 comprises various electronic components (collectively referred to as "circuitry"), such as a laminated battery 12, a set of microchips 14, a sensor 16, a sensor hub 18, antenna 20, and an assortment of integrated passive devices (IPD) 22A, 22B and 22C. The circuitry is applied, secured, embedded or otherwise affixed to substrate 24, which is flexible—e.g., stretchable, bendable and/or compressible—as described herein. As such, the substrate 24 can be made of a plastic material or an elastomeric material, or combinations thereof. Examples of suitable flexible elastomers for the IC substrate material include polymeric organosilicon compounds (commonly referred to as "silicones"), including Polydimethylsiloxane (PDMS). Other non-limiting examples of materials suitable for the substrate 24 include polyimide, photopatternable silicon, SU8 polymer, PDS polydustrene, parylene and its derivatives and copolymers (parylene-N), ultrahigh molecular weight polyethylene, polyether ether ketones (PEEK), polyurethanes, polylactic acid, polyglycolic acid, polymer composites, silicones/siloxanes, polytetrafluoroethylene, polyamic acid, polymethyl acrylate, and combinations thereof. The substrate 24 can take on any possible number of shapes, sizes, and configurations. In the illustrated example, the substrate is substantially flat and, in some embodiments, configured to be an elongated sheet or strip.

The circuitry of FIG. 1 comprises one or more sensors 16 (also termed "sensor devices") to detect any of various parameters. These parameters can include, in any combination, thermal parameters (e.g., temperature), optical parameters (e.g., infrared energy), electrochemical and biochemical parameters, such as pH, enzymatic activity, blood components (e.g., glucose), ion concentrations, and protein concentrations, electrical parameters (e.g., resistance, conductivity, impedance, etc.), acoustic parameters, tactile parameters (e.g., pressure, surface characteristics, or other topographic features), etc. In this regard, one or more of the sensors 16 may be a thermocouple, a silicon band gap temperature sensor, a thin-film resistance temperature device, an LED emitter, a photodetector, a piezoelectric sensor, an ultrasonic sensor, an ion sensitive field effect transistor, etc. For some implementations, one or more of the sensors 16 can be coupled to a differential amplifier and/or a buffer and/or an analog to digital converter. The sensor hub 18, which may be in the nature of a microcontroller or digital signal processor (DSP), operates to integrate data signals from the sensor(s) 16 and process such signals. Signals from the sensor(s) 16 can be processed using multiplexing techniques, and can be switched into and processed by one or a few amplifier/logic circuits, including one or more of the microchips 14.

Battery 12 acts as a power source to supply power to the circuitry in the flexible IC system 10 of FIG. 1. Any suitable battery which is small in size and has a sufficiently long life with a suitable amp-hour capacity may be employed. It is also within the scope of this disclosure to employ alternative means for powering the system 10, including external power supplies. According to some embodiments, the flexible IC system 10 also includes a data transmission facility with an RF antenna 20 to wirelessly communicate with external devices. The antenna 20 can take on various forms, including a printed trace antenna coil with vias, which may be operable as a low frequency, high frequency or ultra-high frequency antenna. Other forms of wired and wireless signal transmission are also within the scope of this disclosure. Each integrated passive device (IPD) 22A-22C may comprise, as some non-limiting examples, a filter, a transformer, a photodiode, LED, TUFT, electrode, semiconductor, duplexer, coupler, phase shifter, thin-film device, circuit element, control elements, capacitors, resistors, inductors, buffer or other passive component. IPD's 22A-22C can be fabricated as standalone devices each having a silicon chip that may be connected to an active integrated circuit (e.g., a microprocessor).

For embodiments where the substrate 24 is stretchable or compressible, the illustrated circuitry is configured in applicable manners, such as those described herein, to be stretchable or compressible and/or to accommodate such stretching/compressing of the substrate 24. Similarly, for embodiments where the substrate 24 is bendable, but not necessarily stretchable, the illustrated circuitry is configured in applicable manners, such as those described herein, to be bendable and/or accommodate such bending of the substrate. For example, each of the illustrated modules or "islands" is connected to one or more adjacent modules with flexible wirebonded interconnects, some of which are designated generally as 26 in FIG. 1. The connection point of the individual interconnects to a device island may be anywhere along the device island edge, or may be at a point on the top surface of the device island (i.e., the surface opposite the substrate 24). The bond wires 26 are attached to externally mounted bond pads 28 on the modules and extend to a corresponding externally mounted bond pad 28 on an adjacent module. The bond wires can be attached through any known wirebonding technique, such as: ultrasonic bonding which uses a combination of pressure and ultrasonic vibration bursts to form a metallurgical cold weld; thermocompression bonding which uses a combination of pressure and elevated temperature to form a weld; and thermosonic bonding which uses a combination of pressure, elevated temperature, and ultrasonic vibration bursts to form a weld joint.

Turning next to FIG. 2, there is shown a cross-sectional illustration of a representative flexible electronic circuit system, designated generally as 100, with multi-layer IC modules connected via pliant wirebonded interconnects. While differing in appearance, the flexible IC system 100 of FIG. 2 can take on any of the various forms, optional configurations, and functional alternatives described herein with respect to the examples shown in FIGS. 1 and 3-5, and thus can include any of the corresponding options and features. Like the system 10 of FIG. 1, for example, the system 100 of FIG. 2 may be configured as an ultrathin, extremely stretchable integrated circuit system. Moreover, system 100 comprises an assortment of discrete devices—e.g., first, second and third discrete devices 102A, 102B and 102C—that are arranged in a "device island" arrangement and electrically coupled by pliant wirebonded interconnects. It is contemplated that the system 100 comprise greater or fewer than the three discrete devices shown in FIG. 2, each of which may take on alternative forms and configurations.

In the embodiment of FIG. 2, each of the discrete devices 102A-102C includes a flexible multi-layer integrated circuit (IC) package capable of performing one or more of the functions described herein. The multi-layer IC package of each discrete device, for example, includes a respective microchip—first, second and third microchips 104A, 104B and 104C—embedded in or on a respective flexible polymeric substrate—first, second and third substrates 106A, 106B and 106C. The polymeric substrates 106A-106C may be fabricated in any industry-recognized manner and from any of the materials described above with respect to the substrate 24 of FIG. 1. Optionally, the substrates 106A-106C may be fabricated from a liquid crystal polymer or a polyimide polymer, such as KAPTON® film available from DuPont™. The polymeric substrate can have a thickness of about 60 μm to about 85 μm or, in some embodiments, about 25 μm to about 50 μm or, in some embodiments, about 7 μm to about 10 μm. Each substrate may also comprise a layer of a flexible polymer disposed on a layer of conductive material, such as copper, gold, aluminum, or some combination thereof. In an example, PCB metal layers can be patterned on opposing sides of the polymeric substrate 106A-106C.

One or more or all of the microchips 104A-104C may be a "thin chip" configuration with a thickness of about 2-7 μm or, in some embodiments, a thickness of about 5-7 μm or, in some embodiments, a thickness of about 3-5 μm or, in some embodiments, a thickness of about 2-3 μm. In the representative systems, methods and devices described herein, each thin chip can be one or more passive electronic devices and/or one or more active electronic devices. By comparison, a thin chip may be fabricated onto a silicon-based semiconductor die 104 with a thickness of approximately 35-50 μm or, in some embodiments, a thickness of approximately 15-25 μm or, in some embodiments, a thickness of approximately 10-15 μm, for example. Non-limiting examples of devices that can be embedded according to any of the principles described herein include an amplifier, a transistor, a photodiode array, a photodetector, a sensor, a light-emitting device, a photovoltaic device, a semiconductor laser array, an optical imaging device, a logic gate array, a microprocessor, an opto-electronic device, a microelectromechanical device, a microfluidic device, a nanoelectromechanical device, a thermal device, or other device structures.

A pair of adhesive layers is disposed on opposing sides of the flexible polymeric substrates 106A-106C of the multi-layer IC package of each discrete device 102A-102C. In an example, the first flexible multi-layer IC package includes a first pair of adhesive layers 108A, each of which is attached to a respective side of the first polymeric substrate 106A. Likewise, the second flexible multi-layer IC package includes a second pair of adhesive layers 108B, each of which is attached to a respective side of the second polymeric substrate 106B. In addition, the third multi-layer IC package includes a third pair of adhesive layers 108C, each of which is attached to a respective side of the third polymeric substrate 106C. Each layer of adhesive can have a thickness of about 8 μm to about 35 μm or, in some embodiments, about 20 μm to about 35 μm or, in some embodiments, about 12 μm to about 15 μm or, in some embodiments, about 8 μm to about 10 μm. The adhesive can be a conductive adhesive or a non-conductive (dielectric) adhesive that is configured to withstand the temperatures of further processing. Conductive adhesive can be used to establish electrical communication between the conductive material of the substrate and conductive contact pads on the top surface of the thin chip. In an example, the adhesive layers 108A-108C can be a fluropolymer adhesive, a polyimide (PI) adhesive, an epoxy adhesive, or an acrylic adhesive, such as PYRALUX® Bond-Ply available from DuPont™. Optionally, the material of adhesive layer can be selected such that it is a non-conductive electrical insulator capable of adhering the adjacent layers. Each multi-layer IC package may optionally include additional adhesive layers, as represented in FIG. 2 by the additional pair of adhesive layers 108D attached to the outer surfaces of the first adhesive layers 108A. With the additional layers, the total thickness of the adhesive may be as large as 85 μm, according to some embodiments.

As illustrated in FIG. 2, the flexible multi-layer IC package of each discrete device 102A-102C further comprises a pair of electrically conductive (polymeric or metallic) layers on opposing sides of the flexible polymeric substrates 106A-106C. For example, the first flexible multi-layer IC package includes a first pair of metallic sheets 110A attached via the first adhesive layers 108A to the first flexible polymeric substrate 106A. Likewise, the second multi-layer IC package includes a second pair of metallic sheets 110B attached via the second adhesive layers 108B to the second flexible polymeric substrate 106B. In addition, the third multi-layer IC package includes a third pair of metallic sheets 110C attached via the third adhesive layers 108C to the third flexible polymeric substrate 106C. Each metallic sheet can have a thickness of about 5 μm to about 20 μm or, in some embodiments, about 15 μm to about 20 μm or, in some embodiments, about 10 μm to about 12 μm or, in some embodiments, about 5 μm to about 8 μm. Electrically conductive metallic layers can be fabricated, for example, from copper or aluminum or a combination thereof.

One or more vias can be generated as channels (e.g., with a laser drill) extending through outer layers of each flexible multi-layer IC package to allow for conductive connections between different layers of the multi-layer stack. In FIG. 2, for example, the first multi-layer IC package includes a first pair of vias 112A that extend through a (top) conductive sheet 110A and corresponding (top) adhesive layer 108A to the first microchip 104A. In the same vein, the second multi-layer IC package includes a second pair of vias 112B that extend through a (top) conductive sheet 110B and corresponding (top) adhesive layer 108B to the second microchip 104B. Likewise, the third multi-layer IC package includes a third pair of vias 112C that extend through a (top) conductive sheet 110C and corresponding (top) adhesive layer 108C to the second microchip 104C. Once these vias have been created, the vias can be electroplated or filled through sputtering or other known technique to create electrical connections from the top conductive layer to an electrical contact pad of the chip. The conductive layers can then be patterned and an overlay can be applied to the outer surface of each conductive layer. In some implementations, the overlay is non-conductive polymer.

On the outer surface of each discrete device 102A-102C are one or more electrical connection pads 114A, 114B and 114C, respectively, for electrically coupling with adjacent devices. By way of non-limiting example, the first discrete device 102A is shown with two electrical connection pads 114A on the top surface of the first multi-layer IC package to provide electrical communication with the first microchip 104A, while the second discrete device 102B is shown with two electrical connection pads 114B on the top surface of the second multi-layer IC package to provide electrical communication with the second microchip 104B. Similarly, the third discrete device 102C is shown with at least one electrical connection pad 114C on the top surface of the third multi-layer IC package to provide electrical communication with the third microchip 104C. Optionally, the first discrete device 102A includes a corresponding set of surface-mount-technology (SMT) components 118A mounted on the first outer surface of the first flexible multi-layer IC package, and the second discrete device 102B includes a second set of SMT components 118B mounted on the outer surface of the second flexible multi-layer IC package.

It is contemplated that one or more or all of the illustrated multi-layer IC packages comprise additional or fewer layers than the sandwich constructions shown in FIG. 2. It should also be noted that the use of the term "layer" in the description and claims does not necessarily require that particular segment of the sandwich construction be continuous or span the entirety of (i.e., be coextensive with) all remaining layers unless otherwise explicitly stated in the claims. While preferable in some applications, it is not necessary in practice that the adhesive layers of each package be fabricated from the same material and the conductive layers be fabricated from the same material. Moreover, the individual packages may be vacuum laminated as discrete, unitary structures prior to electrical coupling with one or more adjacent devices.

Discrete flexible interconnects are attached to and electrically connect the electrical connection pad of one discrete device to the electrical connection pad of another discrete device. In accord with the flexible IC system 100 of FIG. 2, a discrete flexible interconnect in the form of a curvilinear wirebond 120AB is attached or coupled to and electrically connects a first (right) electrical connection pad 114A of the first discrete device 102A to a second (left) electrical connection pad 114B of the second discrete device 102B. Likewise, a discrete flexible interconnect in the form of a curvilinear wirebond 120AC is attached or coupled to and electrically connects a first (left) electrical connection pad 114A of the first discrete device 102A to a third (right) electrical connection pad 114C of the third discrete device 102C. In the illustrated example, the flexible interconnects each comprise one or more pliant metal wires, e.g., made from copper or gold with a circular cross-section, each of which may comprise in-plane loops (one of which can be seen to the far right in FIG. 2) or out-of-plane-loops, or both, that increase the elasticity of the wire. Examples of such in-plane loops and out-of-plane-loops are depicted and described in commonly owned U.S. Pat. No. 8,536,667, which is incorporated herein by reference in its entirety and for all purposes. Any in-plane or out-of-plane loops help to ensure a sufficient degree of stretchability and flexibility. These wirebonded interconnects are fabricated separately from and subsequently attached to the discrete flexible IC modules (e.g., using thermosonic wirebonding techniques). Proper solder joints and welds are created to attach the interconnects to the externally mounted pads and thereby ensure reliability of the interconnects.

FIG. 3 illustrates another representative flexible electronic circuit system, designated generally as 200, with multi-layer IC modules that are connected via pliant multi-layer polymeric interconnects. Like reference numerals are used in FIGS. 3 and 4 to indicate similar structure from FIG. 2. For example, the system 200 of FIG. 3 and the system 300 of FIG. 4 each comprises a similar assortment of discrete devices—e.g., first, second and third discrete devices 102A, 102B and 102C—that are arranged in a "device island" arrangement and electrically coupled by pliant electrical interconnects. Moreover, the flexible IC systems 200 and 300 can take on any of the various forms, optional configurations, and functional alternatives described herein with respect to the other examples shown in the figures, and vice versa, unless explicitly or logically prohibited.

Discrete flexible interconnects mechanically attach to and electrically connect the electrical connection pads of one discrete device to the electrical connection pads of other discrete devices in FIG. 3. The top side of each module 102A-102C is provided with a connection pad 114A, 114B, 114C for electrically connecting to other packages. According to the illustrated example, a first discrete flexible interconnect in the form of a pliant multi-layer semiconductor 220AB is attached or coupled to and electrically connects a first (right) electrical connection pad 114A of the first discrete device 102A to a second (left) electrical connection pad 114B of the second discrete device 102B. Likewise, a second discrete flexible interconnect in the form of a pliant multi-layer semiconductor 220AC is attached to and electrically connects a first (left) electrical connection pad 114A of the first discrete device 102A to a third (right) electrical connection pad 114C of the third discrete device 102C. According to some embodiments, the first discrete flexible interconnect in the form of a pliant multi-layer semiconductor 220AB and the second discrete flexible interconnect in the form of a pliant multi-layer semiconductor 220AC are attached to respective electrical connection pads 114A, 114B, 114C using a traditional solder attach.

The discrete flexible IC modules 102A-102C are built as separate packages with the IC embedded in the substrate. Interconnects 220AB, 220AC are manufactured in separate PCB flex substrates from the IC modules 102A-102C, and can be cut with a serpentine or other non-linear shape to provide stretchability. Examples of interconnects with serpentine shapes are depicted and described in U.S. Pat. Nos. 8,389,862 and 8,729,524, both of which are incorporated herein by reference in their respective entireties and for all purposes. The top side of each module 102A-102C is provided with a connection pad 114A, 114B, 114C for electrically connecting to other packages. Any SMT components required for a particular IC can be mounted on the top surface of the package. It is possible to stack flexible modules on top of each other similar to Package-on-Package (PoP) technology using appropriate solder, etc. Examples of semiconductor devices having package-on-package (POP) configurations are disclosed in U.S. Pat. Nos. 7,696,618 and 7,250,675, both of which are incorporated herein by reference in their respective entireties. In so doing, the input-output connection points (I/Os) for each package can be minimized so as to restrict the number of required interconnections.

The flexible multi-layer IC package of the first discrete device 102A, the flexible multi-layer IC package of the second discrete device 102B, and the multi-layer semiconductors of each flexible interconnect 220AB, 220AC may all comprise common layers of materials, according to some embodiments. For instance, according to some embodiments, each interconnect 220AB, 220AC comprises a polymeric substrate 206A and 206B, respectively, that may be fabricated from a liquid crystal polymer or a polyimide polymer, such as KAPTON® film. According to some embodiments, the flexible interconnects 220AB, 220AC further comprise a pair of electrically conductive (polymeric or metallic) layers 210A and 210B, respectively, on opposing sides of the flexible polymeric substrates 206A, 206B. These electrically conductive layers can be fabricated, for example, from copper or aluminum or a combination thereof. First and second pairs of adhesive layers 208A and 208B are disposed on opposing sides of the flexible polymeric substrates 206A, 206B, respectively, covering one of the conductive layers 210A, 210B. Similar to the adhesive layers 108A-108C of the discrete devices 102A-102C, the adhesive layers 208A, 208B of the flexible interconnects 220AB, 220AC can be a fluropolymer adhesive, a polyimide (PI) adhesive, an epoxy adhesive, or an acrylic adhesive, such as PYRALUX® Bond-Ply.

Figure 4:
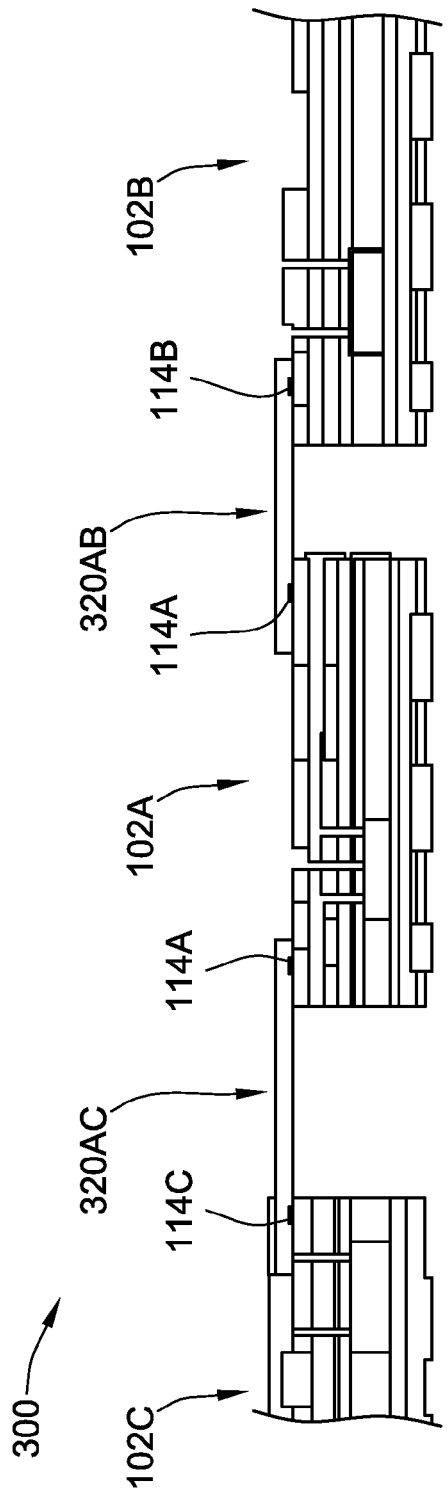
FIG. 4 is a cross-sectional side-view illustration of a representative flexible electronic circuit system with a plurality of multi-layer IC modules connected by pliant conductive-paste interconnects in accord with aspects of the present disclosure.

FIG. 4 illustrates yet another representative flexible electronic circuit system, designated generally as 300, this time utilizing pliant conductive-paste-based interconnects to connect the discrete multi-layer IC modules. According to the illustrated example, a first discrete flexible interconnect in the form of a conductive substrate fabricated from an electrically conductive paste 320AB is attached or coupled to and electrically connects a first (right) electrical connection pad 114A of the first discrete device 102A to a second (left) electrical connection pad 114B of the second discrete device 102B. Likewise, a second discrete flexible interconnect in the form of a conductive substrate fabricated from an electrically conductive paste 320AC is attached or coupled to and electrically connects a first (left) electrical connection pad 114A of the first discrete device 102A to a third (right) electrical connection pad 114C of the third discrete device 102C. Each flexible interconnect 320AB, 320AC may comprise a web of metallic interconnects (e.g., copper or gold or a conductive polymer or paste) that printed or otherwise patterned, for example, using screen print or ink jet printing techniques onto the substrate.

Figure 5:
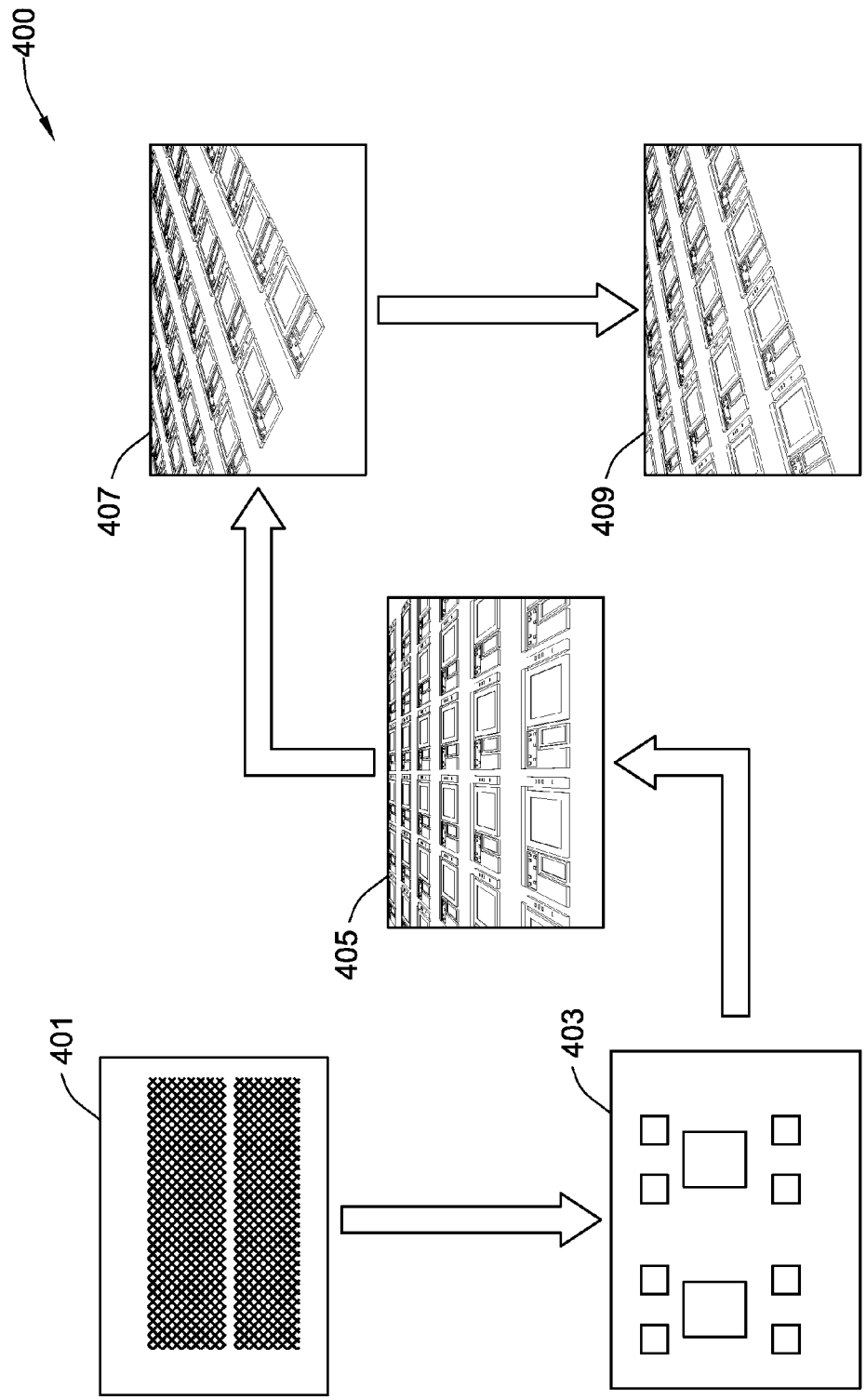
FIG. 5 is a process and assembly flow diagram for fabricating a flexible integrated circuit system in accord with aspects of the present disclosure.

FIG. 5 illustrates a representative method 400 for manufacturing flexible integrated circuits. This method will be described with reference to the various configurations and features shown in FIGS. 1 through 4 of the drawings; such reference is being provided purely by way of explanation and clarification. At block 401, the method 400 includes embedding a thin die in large panels, punching out known good flexible parts or "KGFP," and sorting into waffle trays. Thus, the individual circuits can be tested before being punched out thereby reducing the potential for distributing malfunctioning parts. Next, the method 400 includes picking and placing the flex packages (e.g., the KGFP's are identified and sorted while any malfunctioning circuits are left) onto temporary rigid substrates (reusable substrate with disposable adhesive), as indicated at block 403. The adhesive strength can be modulated by light and/or heat. At block 405, wirebond flex package assemblies are placed on rigid substrates as a temporary carrier for copper wirebonding. The method 400 proceeds to block 407 to encapsulate the top side of the devices and remove the temporary substrate from the bottom. Block 409 includes encapsulating the bottom side of the devices and die cutting.

Also presented herein is a method for assembling flexible integrated circuits. This method includes, in any logical order and any logical combination: providing a first discrete device with a first flexible multi-layer integrated circuit (IC) package including a first outer surface with a first electrical connection pad; providing a second discrete device with a second flexible multi-layer integrated circuit (IC) package including a second outer surface with a second electrical connection pad; and electrically connecting a discrete flexible interconnect to the first electrical connection pad of the first discrete device and the second electrical connection pad of the second discrete device. The flexible interconnect may comprise one or more pliant metal wires. Optionally or alternatively, the flexible interconnect comprises a pliant multi-layer semiconductor or a conductive substrate fabricated from an electrically conductive paste. The first multi-layer IC package may comprise a first microchip embedded in or on a first flexible polymeric substrate, a first adhesive layer on the first flexible polymeric substrate, and a first conductive sheet attached to the first flexible polymeric substrate by the first adhesive layer. Likewise, the second flexible multi-layer IC package may comprise a second microchip embedded in or on a second flexible polymeric substrate, a second adhesive layer on the second flexible polymeric substrate, and a second conductive sheet attached to the second flexible polymeric substrate by the first adhesive layer.

In some embodiments, the aforementioned methods each includes at least those steps shown in FIG. 5 and/or those steps enumerated above. It is also within the scope and spirit of the present disclosure to omit steps, include additional steps, and/or modify the order presented herein. It should be further noted that each of the foregoing methods can be representative of a single sequence of related steps; however, it is expected that each of these methods will be practiced in a systematic and repetitive manner.

The present disclosure is not limited to the precise construction and compositions disclosed herein; any and all modifications, changes, and variations apparent from the foregoing descriptions are within the spirit and scope of the disclosure as defined in the appended claims. Moreover, the present concepts expressly include any and all combinations and subcombinations of the preceding elements and aspects.

What is claimed:

1. A flexible integrated circuit system comprising:
   a first discrete device with a first flexible multi-layer integrated circuit (IC) package including a first outer surface with a first electrical connection pad, a first flexible polymeric substrate, a first microchip embedded in or on the first flexible polymeric substrate, a first adhesive layer on the first flexible polymeric substrate, and a first conductive layer coupled to the first adhesive layer;
   a second discrete device with a second flexible multi-layer integrated circuit (IC) package including a second outer surface with a second electrical connection pad, a second flexible polymeric substrate, a second microchip embedded in or on the second flexible polymeric substrate, a second adhesive layer on the second flexible polymeric substrate, and a second conductive layer coupled to the second adhesive layer; and
   a discrete flexible interconnect attached to and electrically connecting the first electrical connection pad of the first discrete device to the second electrical connection pad of the second discrete device.

2. The flexible integrated circuit system of claim 1, wherein the discrete flexible interconnect comprises one or more pliant metal wires.

3. The flexible integrated circuit system of claim 2, wherein the one or more pliant metal wires comprise in-plane loops or out-of-plane-loops, or both, configured to increase flexibility.

4. The flexible integrated circuit system of claim 1, wherein the discrete flexible interconnect comprises a pliant multi-layer semiconductor.

5. The flexible integrated circuit system of claim 4, wherein the first flexible multi-layer IC package, the second flexible multi-layer IC package, and the pliant multi-layer semiconductor of the discrete flexible interconnect all comprise common layers of materials.

6. The flexible integrated circuit system of claim 1, wherein the discrete flexible interconnect includes a conductive substrate fabricated from an electrically conductive paste.

7. The flexible integrated circuit system of claim 6, wherein the discrete flexible interconnect comprises a web of metallic interconnects printed onto the substrate.

8. The flexible integrated circuit system of claim 1, wherein the first flexible multi-layer IC package further comprises a first via extending through the first conductive layer and the first adhesive layer to the first microchip, and the second flexible multi-layer IC package further comprises a second via extending through the second conductive layer and the second adhesive layer to the second microchip.

9. The flexible integrated circuit system of claim 1, wherein the first flexible multi-layer IC package includes a first set of surface-mount-technology (SMT) components mounted on the first outer surface, and the second flexible multi-layer IC package includes a second set of SMT components mounted on the second outer surface.

10. The flexible integrated circuit system of claim 1, wherein the discrete flexible interconnect maintains substantially identical electrical conductivity when stretched up to approximately 100% or bent up to approximately 180 degrees, or both.

11. An extremely flexible integrated circuit apparatus comprising:
    a first flexible multi-layer integrated circuit (IC) package including:
      a first flexible polymeric substrate;
      a first microchip embedded in or on the first flexible polymeric substrate;
      a first pair of adhesive layers, each on a respective side of the first flexible polymeric substrate;
      a first pair of conductive sheets, each coupled to the first flexible polymeric substrate by a respective one of the first adhesive layers; and
      a first electrical connection pad attached or coupled to an outer surface of one of the first conductive sheets;
    a second flexible multi-layer integrated circuit (IC) package, which is separate and distinct from the first flexible multi-later IC package, including:
      a second flexible polymeric substrate;
      a second microchip embedded in or on the second flexible polymeric substrate;
      a second pair of adhesive layers, each on a respective side of the second flexible polymeric substrate;
      a second pair of conductive sheets, each coupled to the second flexible polymeric substrate by a respective one of the second adhesive layers; and
      a second electrical connection pad attached or coupled to an outer surface of one of the second conductive sheets; and
    a flexible interconnect separate and distinct from the first and second flexible multi-layer IC packages, the flexible interconnect electrically connecting the first electrical connection pad to the second electrical connection pad.

12. A method for assembling flexible integrated circuits, the method comprising:
    providing a first discrete device with a first flexible multi-layer integrated circuit (IC) package including a first outer surface with a first electrical connection pad, a first flexible polymeric substrate, a first microchip embedded in or on the first flexible polymeric substrate, a first adhesive layer on the first flexible polymeric substrate, and a first conductive sheet attached to the first flexible polymeric substrate by the first adhesive layer;

providing a second discrete device with a second flexible multi-layer integrated circuit (IC) package including a second outer surface with a second electrical connection pad; and electrically connecting a discrete flexible interconnect to the first electrical connection pad of the first discrete device and the second electrical connection pad of the second discrete device.

13. The method of claim 12, wherein the discrete flexible interconnect comprises one or more pliant metal wires.

14. The method of claim 12, wherein the discrete flexible interconnect comprises a pliant multi-layer semiconductor.

15. The method of claim 12, wherein the discrete flexible interconnect includes a conductive substrate fabricated from an electrically conductive paste.

16. The method of claim 12, wherein the second flexible multi-layer IC package comprises a second flexible polymeric substrate, a second microchip embedded in or on the second flexible polymeric substrate, a second adhesive layer on the second flexible polymeric substrate, and a second conductive sheet attached to the second flexible polymeric substrate by the first adhesive layer.

* * * * *